(12) United States Patent
Kang et al.

(10) Patent No.: US 11,386,975 B2
(45) Date of Patent: Jul. 12, 2022

(54) THREE-DIMENSIONAL STACKED MEMORY DEVICE AND METHOD

(71) Applicant: Samsung Electronics Co., Ltd., Suwon-si (KR)

(72) Inventors: Shinhaeng Kang, Suwon-si (KR); Joonho Song, Hwaseong-si (KR); Seungwon Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 577 days.

(21) Appl. No.: 16/456,094

(22) Filed: Jun. 28, 2019

(65) Prior Publication Data

US 2020/0210296 A1    Jul. 2, 2020

(30) Foreign Application Priority Data

Dec. 27, 2018   (KR) .......................... 10-2018-0171133

(51) Int. Cl.
*G06F 11/20*       (2006.01)
*G06F 12/0815*  (2016.01)
(Continued)

(52) U.S. Cl.
CPC ........ *G11C 29/765* (2013.01); *G01R 31/3193* (2013.01); *G06F 11/2094* (2013.01); *G06F 12/0815* (2013.01); *G11C 29/38* (2013.01); *G11C 29/808* (2013.01); *H01L 25/0657* (2013.01); *H01L 25/18* (2013.01);
(Continued)

(58) Field of Classification Search
CPC ..... G11C 29/765; G11C 29/38; G11C 29/808; G01R 31/3193; G06F 11/2094; G06F 12/0815; G06F 2201/82; G06F 2212/1032; H01L 25/0657; H01L 25/18;
(Continued)

(56) References Cited

U.S. PATENT DOCUMENTS 5,592,616 A    1/1997 Finch et al.
6,400,619 B1   6/2002 Hsu et al.
(Continued)

FOREIGN PATENT DOCUMENTS

KR       10-0684471 B1    2/2007

OTHER PUBLICATIONS

Patterson et al., "Computer Organization and Design", Elsevier, 5th Edition, 2014, 793 pages.

*Primary Examiner* — Kyle Vallecillo
(74) *Attorney, Agent, or Firm* — NSIP Law

(57) ABSTRACT

A three-dimensional stacked memory device includes a buffer die having a plurality of core die memories stacked thereon. The buffer die is configured as a buffer to occupy a first space in the buffer die. The first memory module, disposed in a second space unoccupied by the buffer, is configured to operate as a cache of the core die memories. The controller is configured to detect a fault in a memory area corresponding to a cache line in the core die memories based on a result of a comparison between data stored in the cache line and data stored in the memory area corresponding to the cache line in the core die memories. The second memory module, disposed in a third space unoccupied by the buffer and the first memory module, is configured to replace the memory area when the fault is detected in the memory area.

20 Claims, 10 Drawing Sheets

(51) Int. Cl.
  *G11C 29/38* (2006.01)
  *H01L 25/065* (2006.01)
  *H01L 25/18* (2006.01)
  *G11C 29/00* (2006.01)
  *G01R 31/3193* (2006.01)

(52) U.S. Cl.
  CPC .. *G06F 2201/82* (2013.01); *G06F 2212/1032* (2013.01); *H01L 2225/06513* (2013.01); *H01L 2225/06541* (2013.01); *H01L 2225/06565* (2013.01)

(58) Field of Classification Search
  CPC . H01L 2225/06513; H01L 2225/06541; H01L 2225/06565
  See application file for complete search history.

(56) References Cited

U.S. PATENT DOCUMENTS

| | | | |
|---|---|---|---|
| 8,921,991 B2 | 12/2014 | Zhang | |
| 2010/0088550 A1* | 4/2010 | Imai | G11C 29/808 711/144 |
| 2012/0221785 A1 | 8/2012 | Chung et al. | |
| 2013/0246868 A1* | 9/2013 | Takagi | G06F 11/0763 714/719 |
| 2014/0006849 A1* | 1/2014 | Ramirez | G11C 29/4401 714/6.13 |
| 2015/0293854 A1* | 10/2015 | Kalamatianos | G11C 29/4401 714/723 |
| 2016/0274968 A1* | 9/2016 | Warnes | G06F 12/0811 |
| 2019/0004909 A1* | 1/2019 | Alameer | G11C 7/1006 |
| 2019/0102246 A1* | 4/2019 | Criss | G11C 5/04 |
| 2021/0089396 A1* | 3/2021 | Gaikwad | H03M 13/353 |

\* cited by examiner

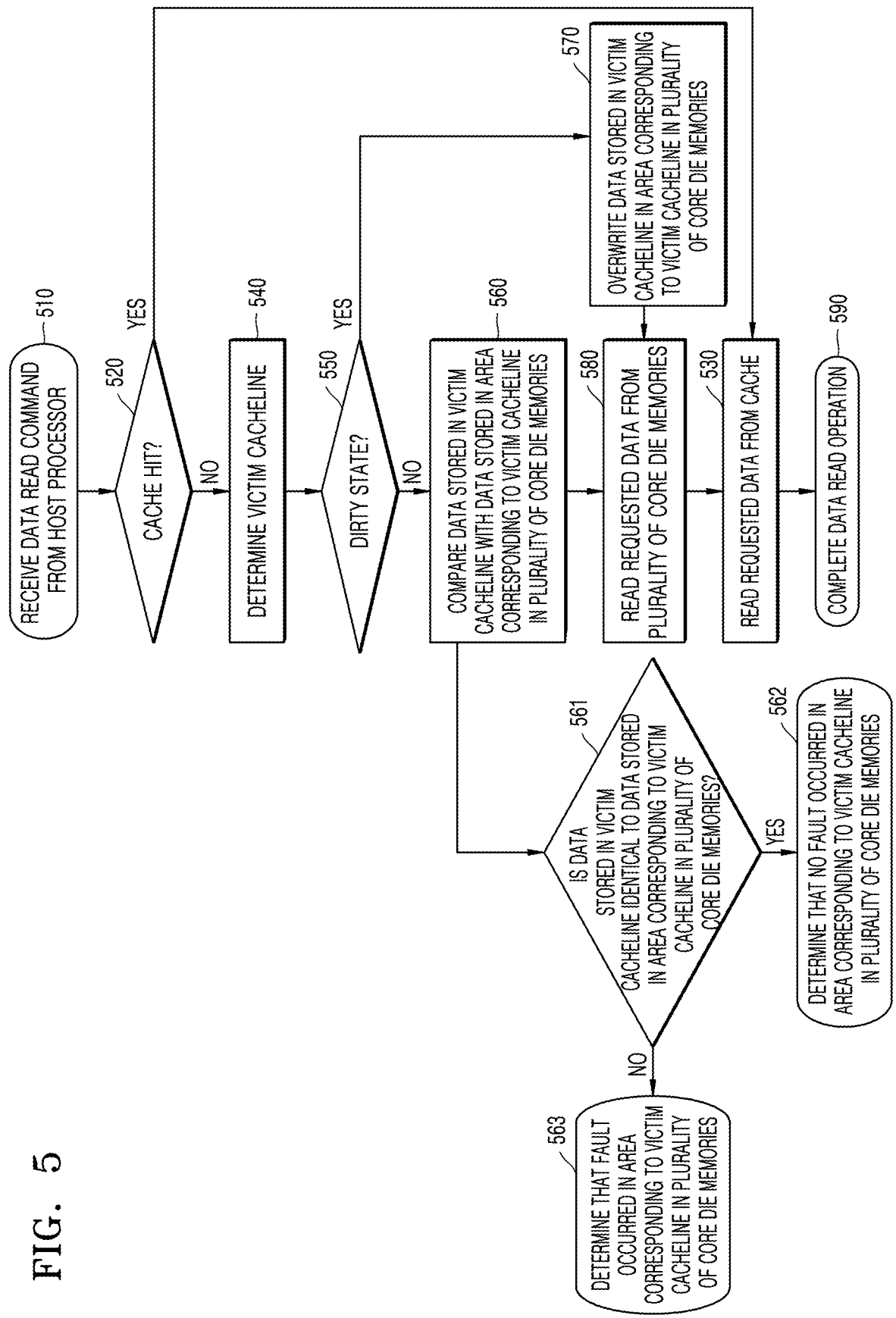

THREE-DIMENSIONAL STACKED MEMORY DEVICE AND METHOD

CROSS-REFERENCE TO RELATED APPLICATION

This application claims the benefit under 35 USC 119(a) of Korean Patent Application No. 10-2018-0171133, filed on Dec. 27, 2018, in the Korean Intellectual Property Office, the entire disclosure of which is incorporated herein by reference for all purposes.

BACKGROUND

1. Field

The present disclosure relates to a three-dimensional stacked memory device and method.

2. Description of the Related Art

With the high-integration of memory devices, for example, semiconductor memory devices, high-integration through typical two-dimensional structures is reaching its limits. For this reason, three-dimensional stacked memory devices including memory cells arranged three-dimensionally are being proposed.

The three-dimensional stacked memory devices have more complicated structures than memory devices of two-dimensional structures, and accordingly, there are difficulties in designing the three-dimensional stacked memory devices.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a three-dimensional stacked memory device includes a plurality of core die memories and a buffer die having the plurality of core die memories stacked thereon. The buffer die is configured as a buffer to occupy a first space in the buffer die. The buffer die includes a first memory module, a controller, and a second memory module. The first memory module, disposed in a second space unoccupied by the buffer and, is configured to operate as a cache of the plurality of core die memories. The controller is configured to detect a fault in a memory area corresponding to a cache line in the plurality of core die memories based on a result of a comparison between data stored in the cache line and data stored in the memory area corresponding to the cache line in the plurality of core die memories. The second memory module, disposed in a third space unoccupied by the buffer and the first memory module and, is configured to replace the memory area when the fault is detected in the memory area. The cache line is of entries in the first memory module.

In response to the controller receiving the comparison result indicating that the data stored in the cache line is different to the data stored in the memory area corresponding to the cache line in the plurality of core die memories, the controller may be further configured to determine that a fault has occurred in the memory area.

In response to a host processor, which is connected to the three-dimensional stacked memory device, trying to access the memory area in which the fault has been detected, the controller may be further configured to control the host processor to access the second memory module instead of the memory area.

The controller may be further configured to determine whether data requested from a host processor connected to the three-dimensional stacked memory device exists in the cache line of entries in the first memory module, and in response to determining that the data requested from the host processor does not exist in the cache line, the controller may be further configured to determine a victim cache line with which is replaced to store the data requested from the host processor.

Based on a value of a dirty bit included in data stored in the victim cache line indicating a clean state, the controller may be further configured to control a comparison between the data stored in the victim cache line and data stored in a memory area corresponding to the victim cache line in the plurality of core die memories.

The clean state may indicate that the data stored in the victim cache line has not been updated.

Based on a value of a dirty bit included in data stored in the victim cache line indicating a dirty state, the controller may be further configured to overwrite the data stored in the victim cache line in a memory area corresponding to the victim cache line in the plurality of core die memories.

The comparison between the data stored in the cache line and the data stored in the memory area corresponding to the cache line in the plurality of core die memories may be performed according to a parallel bit comparison method of comparing, in unit of one bit, bits of the data stored in the cache line in parallel with bits of the data stored in the memory area corresponding to the cache line in the plurality of core die memories.

A parallel bit test module may be configured to perform the comparison between the data stored in the cache line and the data stored in the memory area corresponding to the cache line in the plurality of core die memories is performed, and the parallel bit test module is positioned on the plurality of core die memories.

In response to all or most memory areas of the second memory module replacing memory areas in which faults occurred in the plurality of core die memories, the controller may be further configured to determine whether a hard fault occurred in the memory areas in which the faults have been detected, and to prevent the second memory module from replacing memory areas in which no hard fault occurred from among the memory areas in which the faults have been detected in the plurality of core die memories.

In another general aspect, an operating method of a three-dimensional stacked memory device including a plurality of core die memories and a buffer die configured as a buffer to occupy a first space in the buffer die, the method includes receiving a result of a comparison between data stored in a cache line of entries in a first memory module and data stored in a memory area corresponding to the cache line in the plurality of core die memories, the first memory module, disposed in a second space unoccupied by the buffer and, configured to operate as a cache of the plurality of core die memories; detecting a fault in the memory area based on the comparison result; and controlling a second memory module, disposed in a third space unoccupied by the buffer and the first memory module, to replace the memory area, upon detecting the fault in the memory area.

The detecting of the fault in the memory area may include, in response to receiving the comparison result indicating that the data stored in the cache line is different to the data stored in the memory area corresponding to the cache line in the plurality of core die memories, determining that a fault occurred in the memory area.

The controlling of the second memory module disposed in the third space may include, in response to a host processor, which is connected to the three-dimensional stacked memory device, trying to access the memory area in which the fault has been detected, controlling the host processor to access the second memory module instead of the memory area.

The operating method may further include determining whether data requested from a host processor connected to the three-dimensional stacked memory device exists in the cache line of entries in the first memory module, and in response to determining that the data requested from the host processor does not exist in the cache line, determining a victim cache line with which is replaced to store the data requested from the host processor.

The operating method may further include based on a value of a dirty bit included in data stored in the victim cache line indicating a clean state, comparing the data stored in the victim cache line and data stored in a memory area corresponding to the victim cache line in the plurality of core die memories.

The clean state may indicate that the data stored in the victim cache line has not been updated.

The operating method may further include, based on a value of a dirty bit included in data stored in the victim cache line indicating a dirty state, overwriting the data stored in the victim cache line in a memory area corresponding to the victim cache line in the plurality of core die memories.

The comparison between the data stored in the cache line and the data stored in the memory area corresponding to the cache line in the plurality of core die memories may be performed via a parallel bit comparison method of comparing, in units of one bit, bits of the data stored in the cache line in parallel with bits of the data stored in the memory area corresponding to the cache line in the plurality of core die memories.

The operating method may further include in response to all memory areas of the second memory module replacing memory areas in which faults have been detected in the plurality of core die memories, determining whether a hard fault occurred in the memory areas in which the faults have been detected; and preventing the second memory module from replacing memory areas in which no hard fault occurred from among the memory areas in which the faults have been detected in the plurality of core die memories.

In another general aspect, a non-transitory computer-readable storage medium stores instructions that, when executed by a processor, cause the processor to perform the method described above.

Other features and aspects will be apparent from the following detailed description, the drawings, and the claims.

BRIEF DESCRIPTION OF THE DRAWINGS

FIG. 5 is a flowchart for describing an example of an operation process and a fault detection process of a three-dimensional stacked memory device according to a data read command.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
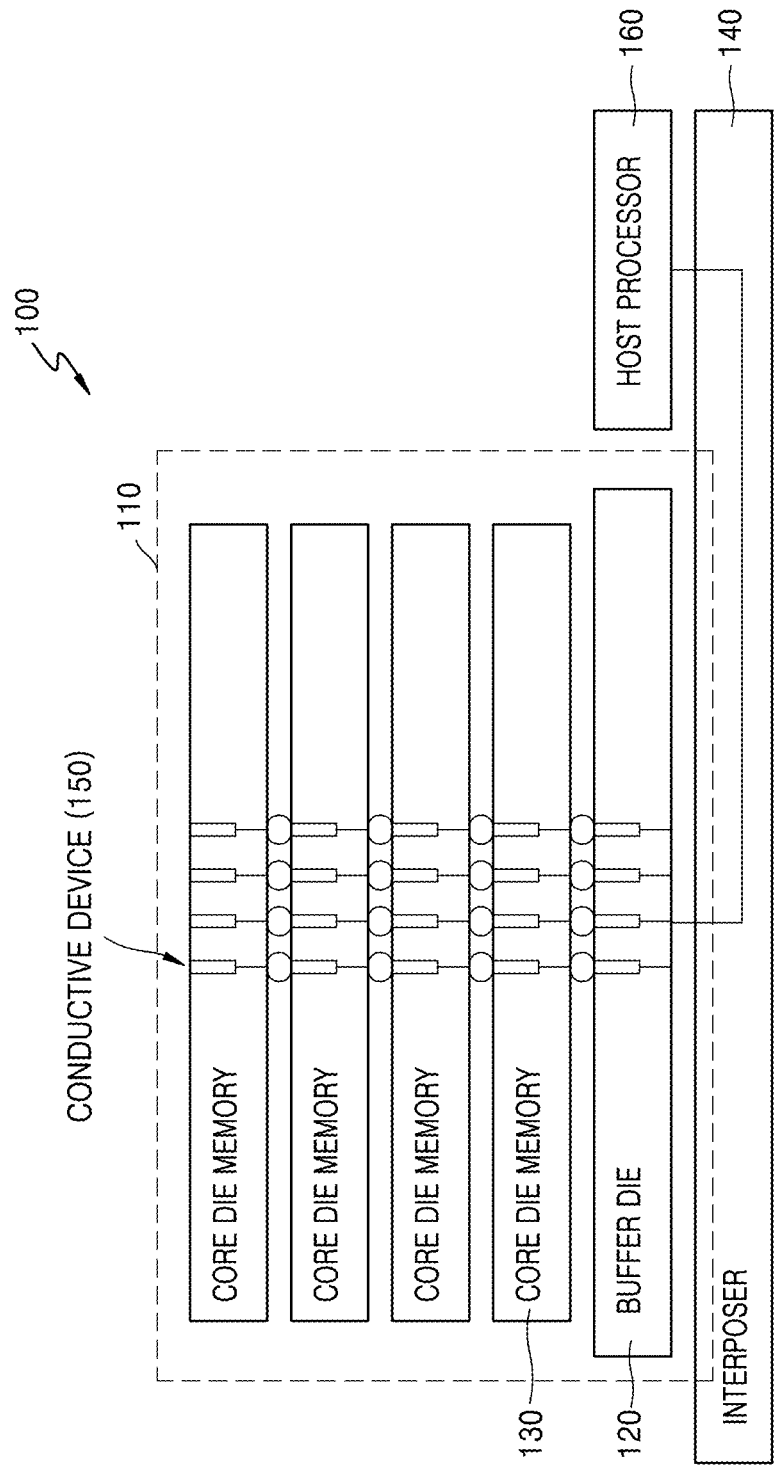
FIG. 1 shows an example of an electronic system configuration including a three-dimensional stacked memory device and a host processor.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 shows an example of an electronic system configuration including a three-dimensional stacked memory device and a host processor.

Referring to FIG. 1, an electronic system 100 may include a three-dimensional stacked memory device 110 and a host processor 160. The three-dimensional stacked memory device 110 may include a buffer die 120, a plurality of core die memories 130 stacked on the buffer die 120, an interposer 140, and a plurality of conductive devices 150. The three-dimensional stacked memory device 110 may be connected to the host processor 160 through the interposer 140. However, in the three-dimensional stacked memory device 110 of FIG. 1, components related to embodiments are shown. Accordingly, the three-dimensional stacked memory device 110 may further include other general-purpose components in addition to the components shown in FIG. 1. In FIG. 1, four core die memories 130 are stacked on the buffer die 120; however, the number of the stacked core die memories 130 is not limited to four, as examples exist with two or more stacked die memories 130. In addition, herein, the use of the term 'may' herein with respect to an example or embodiment, e.g., as to what an example or embodiment may include or implement, means that at least one example or embodiment exists where such a feature is included or implemented while all examples and embodiments are not limited thereto.

In the three-dimensional stacked memory device 110, the buffer die 120, and the plurality of core die memories 130 may be stacked on the interposer 140. The interposer 140 may be an intermediate medium for providing electrical connections between various chips, and may be a silicon interposer.

The buffer die 120 may perform an interface operation for providing a data signal, a command signal, an address signal, and a chip selection signal, etc. received from the host processor 160 to the plurality of core die memories 130, or for providing a data signal received from the plurality of core die memories 130 to the host processor 160. Also, the buffer die 120 may include a circuit for performing a test operation for the plurality of core die memories 130.

The plurality of core die memories 130 may store data processed by the host processor 160 or data that is to be processed by the host processor 160. Also, the plurality of core die memories 130 may read and/or write data requested from the host processor 160. The plurality of core die memories 130 may be dynamic random access memories (DRAMs), although not limited thereto. Each of the plurality of core die memories 130 may be random access memory (RAM) (for example, static random access memory (SRAM)), read-only memory (ROM), electrically erasable programmable read-only memory (EEPROM), CD-ROM, Blue-ray or another optical disk storage, a hard disk drive (HDD), a solid state drive (SSD), or a flash memory, as non-limiting examples.

The three-dimensional stacked memory device 110 may be packaged by stacking the buffer die 120 and the plurality of core die memories 130. In such an example, the plurality of core die memories 130 stacked on the buffer die 120 may be electrically connected to the buffer die 120, and for the electrical connections, the three-dimensional stacked memory device 100 may include the plurality of conductive devices 150 connecting the plurality of core die memories 130 to each other.

For example, in the three-dimensional stacked memory device 110, the conductive devices 150 may be through silicon vias (TSVs). In order for TSVs to be used as conductive devices between the plurality of core die memories 130, the plurality of core die memories 130 in the three-dimensional stacked memory device 110 may include at least one via formed by penetrating the plurality of core die memories 130 vertically.

The host processor 160 may control operations of the system, and perform logical operations. For example, the host processor 160 may be configured with a system-on-chip (SoC). The host processor 160 may include a central processing unit (CPU) or expression of intellectual properties (IPs). The CPU may process or execute programs and/or data stored in the three-dimensional stacked memory device 110. The expression of IPs may include, for example, a graphic processing unit (GPU), a multi-format codec (MFC), a video module (for example, a camera interface, a joint photographic experts group (JPEG) processor, a video processor, a mixer, etc.), an audio system, a display driver, a volatile memory device, a non-volatile memory, a memory controller, a cache memory, a serial port, a system timer, a watch dog timer, an analog-to-digital converter, etc., or other hardware components.

In an example, because the three-dimensional stacked memory device 110 is coupled with the host processor 160 through the interposer 140, when a fault has occurred in a part of the plurality of core die memories 130, the entire board of the host processor 160 may need to be discarded. Accordingly, to overcome such a drawback, a separate memory module may be added on a spare or unused space existing in the buffer die 120. More specifically, when a fault has occurred in a part of the plurality of core die memories 130, the added memory module may be controlled to replace supplement, or stand-in for the part of the plurality of core die memories 130 in which the fault has occurred.

When the stand-in method described above is applied, the typical drawback of needing to discard the entire board of the host processor 160 when a fault has occurred in a part of the plurality of core die memories 130 may be mitigated against while utilizing a spare space of the buffer die 120. Hereinafter, a process of determining whether a fault has occurred in a part of the plurality of core die memories 130 and a process of replacing the part of the plurality of core die memories 130 in which the fault has occurred with a spare space existing in the buffer die 120 will be described in more detail with reference to FIGS. 2 to 8.

Figure 2:
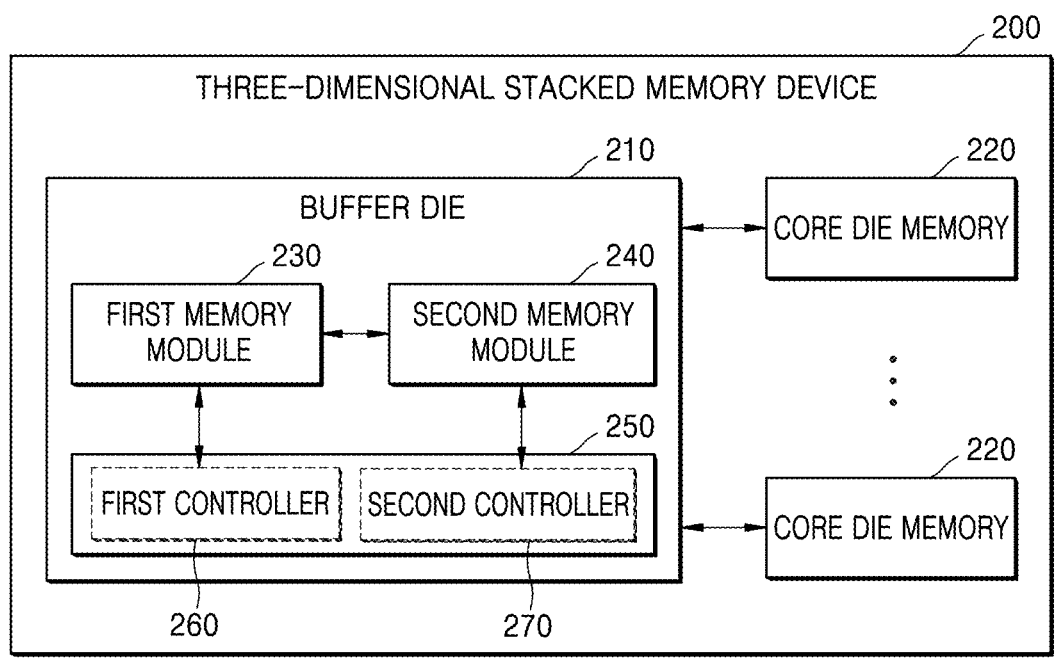
FIG. 2 is a block diagram showing an example of a configuration of a three-dimensional stacked memory device.

FIG. 2 is a block diagram showing an example of a configuration of a three-dimensional stacked memory device.

Referring to FIG. 2, a three-dimensional stacked memory device 200 may include a buffer die 210, and a plurality of core die memories 220. The plurality of core die memories 220 may be stacked on the buffer die 210. The buffer die 210 may further include a first memory module 230, a second memory module 240, and a controller 250 in a spare space. Descriptions of features previously described with reference to FIG. 1 will be omitted for increased clarity and conciseness.

The buffer die 210 may include the first memory module 230 operating as a cache of the plurality of core die memories 220 in a part of the spare space.

The cache may be a memory temporarily storing at least one of data stored in the plurality of core die memories 220. Generally, a host processor connected to the three-dimensional stacked memory device 200 may load commands, instructions, and/or data stored in the plurality of core die memories 220, and process the commands, instructions, and/or data. Because processing speed of the plurality of core die memories 220 are typically significantly slower than that of the host processor, the first memory module 230 may be used as a cache with significantly high processing speed, even though it has a smaller capacity than the plurality of core die memories 220, which may improve the operating speed of the plurality of core die memories 220.

The first memory module 230 may store data accessed most recently by the host processor connected to the three-dimensional stacked memory device 200, e.g., more recently than data accessed in the past. When data requested from the host processor exists in the first memory module 230, the data may be acquired by accessing the first memory module 230 without accessing the plurality of core die memories 220. That is, the first memory module 230 may be used to increase the processing speed of data.

Also, the buffer die 210 may include the controller 250. More specifically, the controller 250 may be a memory controller, and include a first controller 260 for controlling the first memory module 230 and a second controller 270 for controlling the second memory module 240, although not limited thereto. However, the controller 250 may be a single memory controller for controlling the first memory module 230 and the second memory module 240 simultaneously.

The first controller 260 may be a cache controller for controlling the first memory module 230. The first controller 260 may determine whether data requested from the host processor exists in at least one cache line of entries in the first memory module 230. The cache line may mean a unit of data loaded from the plurality of core die memories 220.

When the data requested from the host processor does not exist in the cache line of entries in the first memory module 230, the first controller 260 may determine a victim cache line with which is replaced to store the data requested from the host processor. For example, the first controller 260 may select a victim cache line from among a plurality of cache lines of entries in the cache, and newly store the data requested from the host processor in an area corresponding to the chosen victim cache line in the plurality of core die memories 220.

Data stored in the victim cache line may include a dirty bit. When a value of the dirty bit indicates a clean state, it may be desirable for the data stored in the victim cache line to be identical to data stored in the area corresponding to the victim cache line in the plurality of core die memories 220. When the data stored in the victim cache line is not identical to the data stored in the area corresponding to the victim cache line in the plurality of core die memories 220, it may be determined that a fault has occurred in the area corresponding to the victim cache line in the plurality of core die memories 220. Therefore, when the value of the dirty bit of the data stored in the victim cache line indicates a clean state, the data stored in the victim cache line may be compared with the data stored in the area corresponding to the victim cache line in the plurality of core die memories 220 to determine whether a fault has occurred in the plurality of core die memories 220.

The second controller 270 may control the second memory module 240. The second controller 270 may improve a Reliability/Availability/Serviceability (RAS) function of the three-dimensional stacked memory device 200 by using the second memory module 240. For example, the second controller 270 may detect a fault in the area corresponding to the victim cache line in the plurality of core die memories 220, based on the comparison result between the data stored in the victim cache line and the data stored in the area corresponding to the victim cache line in the plurality of core die memories 220.

When the value of the dirty bit of the data stored in the victim cache line indicates a clean state, the second controller 270 may receive the comparison result indicating that the data stored in the victim cache line is not identical to the data stored in the area corresponding to the victim cache line in the plurality of core die memories 220. In this case, the second controller 270 may determine that a fault has occurred in the area corresponding to the victim cache line in the plurality of core die memories 220. In this case, when the host processor tries to access the area corresponding to the victim cache line in the plurality of core die memories 220, the second controller 270 may control the host process to access the second memory module 240.

The second memory module 240 may be positioned in another part of the spare space of the buffer die 210. The second memory module 240 may be random access memory (RAM) (for example, dynamic random access memory (DRAM) or static random access memory (SRAM)), read-only memory (ROM), electrically erasable programmable read-only memory (EEPROM), CD-ROM, Blue-ray or another optical disk storage, a hard disk drive (HDD), a solid state drive (SSD), or a flash memory, although not limited thereto.

The second memory module 240 may replace, supplement, or stand-in for an area at which a fault has occurred in the plurality of core die memories 220. More specifically, when a fault has been detected in an area corresponding to at least one cache line of entries in the first memory module 230 in the plurality of core die memories 220, the second memory module 240 may replace the area at which the fault has been detected. When the host processor tries to access the area at which the fault has been detected, the second controller 270 may control the host processor to access the second memory module 240, instead of the corresponding area, and accordingly, the second memory module 240 may replace the area at which the fault has been detected in the plurality of core die memories 220.

Figure 3:
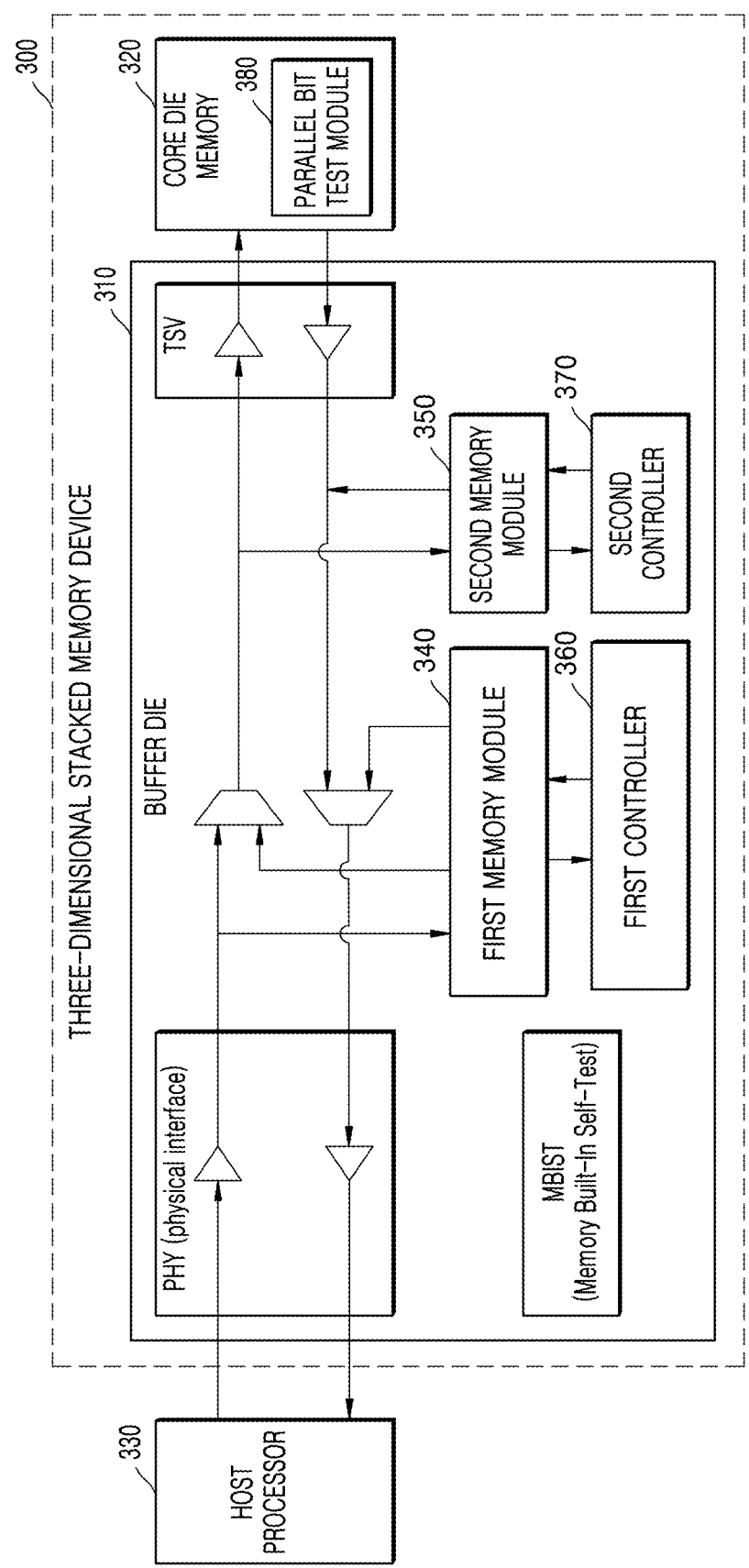
FIG. 3 shows a method in which components operate in a system including a three-dimensional stacked memory device and a host processor.

FIG. 3 shows a method in which components operate in a system including a three-dimensional stacked memory device and a host processor.

Referring to FIG. 3, a three-dimensional stacked memory device 300 may include a buffer die 310 and a core die memory 320, and a host processor 330 may be connected to the core die memory 320 through the buffer die 310. The buffer die 310 may be connected to the core die memory 320 through a conductive device, and the conductive device may be, for example, a TSV.

In FIG. 3, a single core die memory 320 is shown; however, it will be understood by one of ordinary skill in the art that the three-dimensional stacked memory device 300 may include more core die memories. Meanwhile, descriptions previously given with reference to FIGS. 1 and 2 will be omitted.

The buffer die 310 may include, basically, a physical interface (PHY) circuit and a memory built-in self-test circuit (MBIST) circuit. The PHY circuit may receive a signal from the host processor, the core die memory, etc., convert the signal into a signal that may be used in the inside of the corresponding system, demodulate modulated data, and transmit the demodulated data in the form of its original packet to the corresponding system. The MBIST circuit may be a self-test circuit capable of determining whether the three-dimensional stacked memory device 300 operates in a desired manner.

The buffer die 310 may further include a first memory module 340, a second memory module 350, a first controller 360, and a second controller 370 in a spare space remaining after the above-described circuits are located. In an example, the buffer die 310 may further include other general-purpose components in addition to the above-described components.

The first memory module 340 may operate as a cache of, for example, the core die memory 320, and the first controller 360 may correspond to a cache controller. When the first controller 360 receives a data read/write command from the host processor 330, the first controller 360 may determine whether data requested from the host processor 330 exists in at least one cache line of entries in the first memory module 340.

When the data requested from the host processor 330 exists in at least one cache line of entries in the first memory module 340 (cache hit), the first controller 360 may read the data requested from the host processor 330 from the cache line and transfer the data to the host processor 330, or may write the data requested from the host processor 330 in the cache line.

When the data requested from the host processor 330 does not exist in the cache line of entries in the first memory module 340 (cache miss), the first controller 360 may determine a victim cache line from among a plurality of cache lines of entries in the cache. The first controller 360 may newly store the data requested from the host processor 330 in an area corresponding to the victim cache line.

In this case, the first controller 360 may check a value of a dirty bit of the data stored in the victim cache line to determine whether to write back the data stored in the victim cache line on data stored in an area corresponding to the victim cache line in the core die memory 320. The write-back operation of the cache will be described with reference to FIG. 4, below.

Figure 4A:
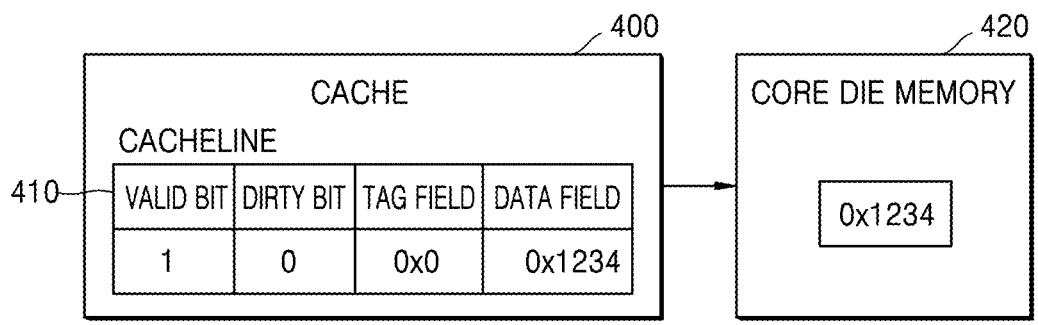
FIGS. 4A, 4B, and 4C show an example of a write-back operation of a cache.
Figure 4B:
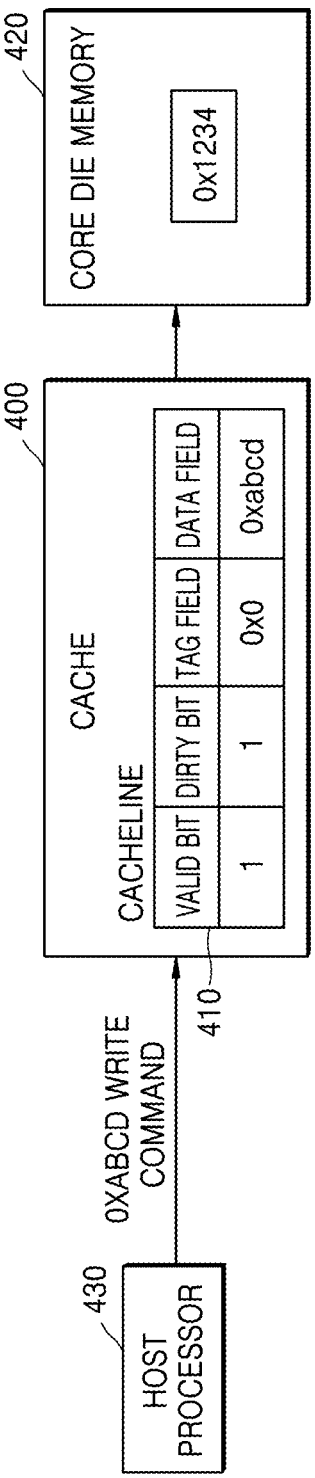
Figure 4C:
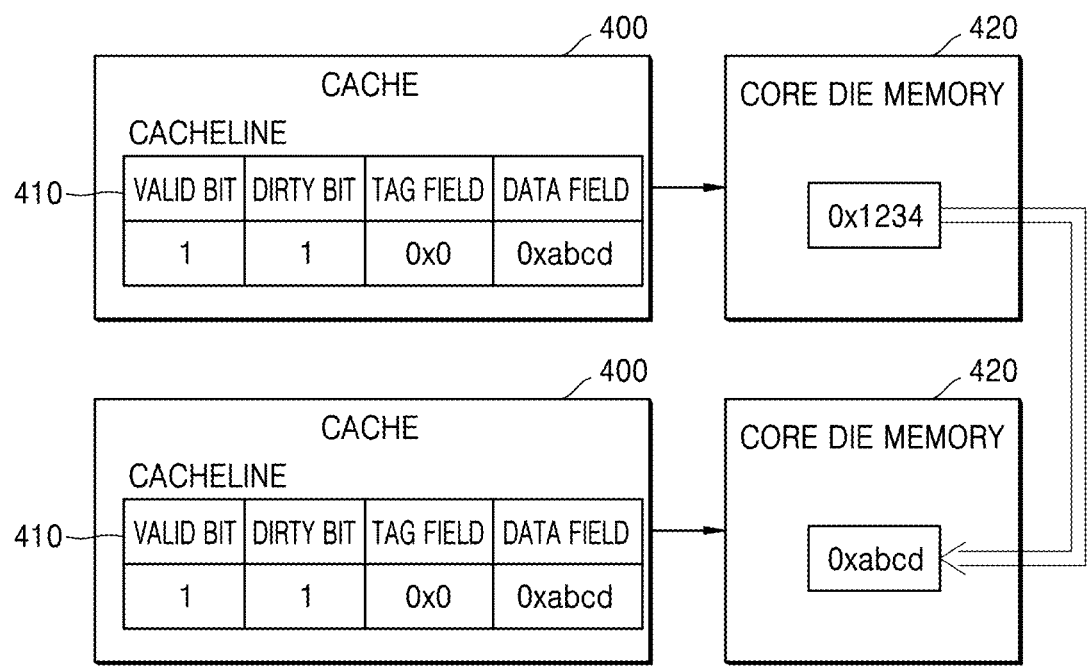

FIGS. 4A, 4B, and 4C show an example of a write-back operation of a cache.

Referring to FIG. 4A, a cache line 410 of entries in a cache 400 may include a valid bit, a dirty bit, a tag field, and a data field.

The valid bit may indicate whether data of the cache line 410 is valid. For example, as shown in FIG. 4A, when a value of the valid bit is 1, this may indicate that the cache line 410 is valid, and when the value of the valid bit is 0, this may indicate that the cache line 410 is invalid, although not limited thereto. However, when the value of the valid bit is 1, this may indicate that the cache line 410 is invalid, and when the value of the valid bit is 0, this may indicate that the cache line 410 is valid.

The dirty bit may indicate whether data of the cache line 410 has been updated. When a value of the dirty bit is 1, this may indicate that data of the cache line 410 has been updated, and when the value of the dirty bit is 0, this may indicate that the data of the cache line 410 has never been updated, although not limited thereto. However, when the value of the dirty bit is 1, this may indicate that data of the cache line 410 has never been updated, and when the value of the dirty bit is 0, this may indicate that the data of the cache line 410 has been updated.

The tag field may be used to determine whether a cache hit or a cache miss has occurred. The first controller 360 may limit cache lines corresponding to an index of an address of data requested from the host processor 330, and when a value of a tag field of one (for example, the cache line 410) among the limited cache lines is identical to a tag value of the address of the requested data, the first controller 360 may determine that a cache hit has occurred in the cache line 410. Meanwhile, when any values of tag fields of all the limited cache lines are not identical to the tag value of the address of the requested data, the first controller 360 may determine that a cache miss has occurred. The data field may correspond to a field in which data of the cache line 410 is stored.

When the host processor 430 stores data newly generated by performing a task in a memory, the newly generated data may be stored in the cache 400, and the cache 400 may operate according to a write-back method of storing the newly generated data later in the core die memory 420.

In the write-back method, when a cache hit has occurred, the newly generated data may be stored in the cache 400 without being stored in the core die memory 420. Likewise, when a cache miss has occurred, a victim cache line may be determined, and simultaneously, the newly generated data may be stored in the cache 400 without being stored in the core die memory 420. In this case, when the data stored in the victim cache line has ever been updated, that is, when a value of the dirty bit is 1, the updated data may be overwritten in an area corresponding to the victim cache line in the core die memory 420.

For example, referring to FIG. 4A, when data of 0×1234 has been stored in the cache line 410 and has never been updated, the data of 0×1234 stored in the cache line 410 may be identical to data stored in the core die memory 420.

However, referring to FIG. 4B, when data of 0×1234 has been updated to 0×abcd, and a command for writing 0×abcd is received from the host processor 430, the data of 0×1234 stored in the cache line 410 may be overwritten to 0×abcd, so that data of 0×abcd may be stored in the cache 400. Accordingly, because the data stored in the cache line 410 has been updated, a value of the dirty bit of the cache line 410 may change to 1. In the write-back method, the updated data may be not immediately written in the core die memory 420, and accordingly, the data of 0×1234 may be still stored in the core die memory 420.

In this case, referring to FIG. 4C, when the cache line 410 in which the data of 0×abcd is stored is determined as a victim cache line with which is replaced to store data newly generated from the host processor 430, the first controller 360 may overwrite the data of 0×abcd in the core die memory 420. According to the write-back method described above, the frequency of access to the core die memory 420 may be reduced.

Referring again to FIG. 3, when a value of the dirty bit of the data stored in the victim cache line indicates a dirty state, the first controller 360 may perform a write-back operation. For example, the first controller 360 may overwrite the data stored in the victim cache line in an area corresponding to the victim cache line in the core die memory 320.

When the value of the dirty bit of the data stored in the victim cache line indicates a clean state, the first controller 360 may newly store the data requested from the host processor 430 in the area corresponding to the victim cache line, without performing a write-back operation.

In an example, because the value of the dirty bit indicates a clean state means that the data stored in the victim cache line has never been updated, it may be desirable for the data stored in the victim cache line to be identical to the data stored in the area corresponding to the victim cache line in the core die memory 320. When the data stored in the victim cache line is not identical to the data stored in the area corresponding to the victim cache line in the core die memory 320, it may be predicted that a fault exists in the area corresponding to the victim cache line in the core die memory 320.

When the value of the dirty bit of the data stored in the victim cache line indicates a clean state, a parallel bit test module 380 may compare the data stored in the victim cache line with the data stored in the area corresponding to the victim cache line in the core die memory 320. The parallel bit test module 380 may perform the comparison according to a parallel bit comparison method. Also, the parallel bit test module 380 may transmit the comparison result between the data stored in the victim cache line and the data stored in the area corresponding to the victim cache line in the core die memory 320, to the second controller 370. In an example, the parallel bit test module 380 may be positioned on the core die memory 320, although not limited thereto. The parallel bit test module 380 will be described in detail with reference to FIG. 7, later.

When the second controller 370 receives the comparison result indicating that the data stored in the victim cache line is not identical to the data stored in the area corresponding to the victim cache line in the core die memory 320 from the parallel bit test module 380, the second controller 370 may determine that a fault has occurred in the area corresponding to the victim cache line in the core die memory 320. In this case, the second controller 370 may control the second memory module 350 to replace the area corresponding to the victim cache line in the core die memory 320. Also, when the second controller 370 receives the comparison result indicating that the data stored in the victim cache line is identical to the data stored in the area corresponding to the victim cache line in the core die memory 320 from the parallel bit test module 380, the second controller 370 may determine that no fault has occurred in the area corresponding to the victim cache line in the core die memory 320.

More specifically, when the host processor 330 tries to access the area corresponding to the victim cache line in the core die memory 320, the second controller 370 may control the host processor 330 to access the second memory module 350 instead of the corresponding area. Accordingly, although a fault has occurred in a part of the core die memory 320, the part of the core die memory 320 may be replaced by the second memory module 350 positioned in a spare space of the buffer die 310. Therefore, it may be unnecessary to replace the entire of the core die memory 320, and the reliability of the three-dimensional stacked memory device 300 may be improved. The method may reduce overhead for fault detection compared with a method of using fault detection codes or a method of storing a copy of data stored in the core die memory 320.

In an example, when all or most areas of the second memory module 350 replace areas at which faults have been detected in the core die memory 320, the second controller 370 may determine whether a hard fault has occurred in the areas at which the faults have been detected in the core die memory 320. The hard fault, in contrast to a soft fault, means that the detected fault may not be recoverable. The second controller 370 may prevent the second memory module 350 from replacing areas at which no hard fault has occurred among the areas at which the faults have been detected. Accordingly, when there is no space of the second memory module 350 that will replace an area at which a fault has been detected in the core die memory 320, a space of the second memory module 350 replacing areas at which no hard fault has occurred may be again used as a spare space. Therefore, the second memory module 350 may be efficiently used.

FIG. 5 is a flowchart for describing an example of an operation process and a fault detection process of a three-dimensional stacked memory device according to a data read command.

In operation 510, the three-dimensional stacked memory device may receive a data read command from a host processor. The data read command may include an index and a tag value of an address of data.

In operation 520, the three-dimensional stacked memory device may determine whether a cache hit has occurred. More specifically, the three-dimensional stacked memory device may limit cache lines through the index of the address of the data requested from the host processor. Then, when a value of a tag field of a cache line among the limited cache lines is identical to the tag value of the address of the data requested from the host processor, the three-dimensional stacked memory device may determine that a cache hit has occurred. When the value of the tag field of the cache line is not identical to the tag value of the address of the data requested from the host processor, the three-dimensional stacked memory device may determine that a cache miss has occurred. When the three-dimensional stacked memory device determines that a cache hit has occurred, the three-dimensional stacked memory device may proceed to operation 530. However, when the three-dimensional stacked memory device determines that a cache miss has occurred, the three-dimensional stacked memory device may proceed to operation 540.

In operation 530, the three-dimensional stacked memory device may read the requested data from a cache. For example, the three-dimensional stacked memory device may limit cache lines through the index of the address of the data requested from the host processor, read data of a cache line having a value of a tag field that is identical to the tag value of the address of the data requested from the host processor among the limited cache lines, and transfer the data of the cashline to the host processor.

In operation 540, the three-dimensional stacked memory device may determine a victim cache line. The three-dimensional stacked memory device may determine a victim cache line with which is replaced to store the data requested from the host processor.

In operation 550, the three-dimensional stacked memory device may determine whether the victim cache line is in a dirty state. Data stored in the victim cache line may include a dirty bit, and when a value of the dirty bit is 1, this may indicate that the victim cache line is in a dirty state. When the value of the dirty bit is 0, this may indicate that the victim cache line is in a clean state. When the victim cache line is in a dirty state, this may indicate that data stored in the victim cache line has been updated. When the victim cache line is in a clean state, this may indicate that data stored in the victim cache line has never been updated. When the victim cache line is in a clean state, the three-dimensional stacked memory device may proceed to operation 560, and when the victim cache line is in a dirty state, the three-dimensional stacked memory device may proceed to operation 570.

In operation 560, when the three-dimensional stacked memory device determines that the victim cache line is in a clean state, the three-dimensional stacked memory device may compare data stored in the victim cache line with data stored in an area corresponding to the victim cache line in a plurality of core die memories. Because that the value of the dirty bit indicates a clean state means that the data stored in the victim cache line has never been updated, it may be desirable for the data stored in the victim cache line to be identical to the data stored in the area corresponding to the victim cache line in the plurality of core die memories. Therefore, when the data stored in the victim cache line is not identical to the data stored in the area corresponding to the victim cache line in the plurality of core die memories, it may be predicted that a fault exists in the area corresponding to the victim cache line in the plurality of core die memories.

In operation 561, the three-dimensional stacked memory device may determine whether the data stored in the victim cache line is identical to the data stored in the area corresponding to the victim cache line in the plurality of core die memories. When the data stored in the victim cache line is identical to the data stored in the area corresponding to the victim cache line in the plurality of core die memories, the three-dimensional stacked memory device may proceed to operation 562. However, when the data stored in the victim cache line is not identical to the data stored in the area corresponding to the victim cache line in the plurality of core die memories, the three-dimensional stacked memory device may proceed to operation 563.

In operation 562, the three-dimensional stacked memory device may determine that no fault has occurred in the area corresponding to the victim cache line in the plurality of core die memories.

In operation 563, the three-dimensional stacked memory device may determine that a fault has occurred in the area corresponding to the victim cache line in the plurality of core die memories.

In operation 570, when the three-dimensional stacked memory device determines that the victim cache line is in a dirty state, the three-dimensional stacked memory device may overwrite the data stored in the victim cache line in the area corresponding to the victim cache line in the plurality of core die memories.

In operation 580, the three-dimensional stacked memory device may read the data requested from the host processor from the plurality of core die memories.

In operation 590, the data read operation may be completed.

Figure 6:
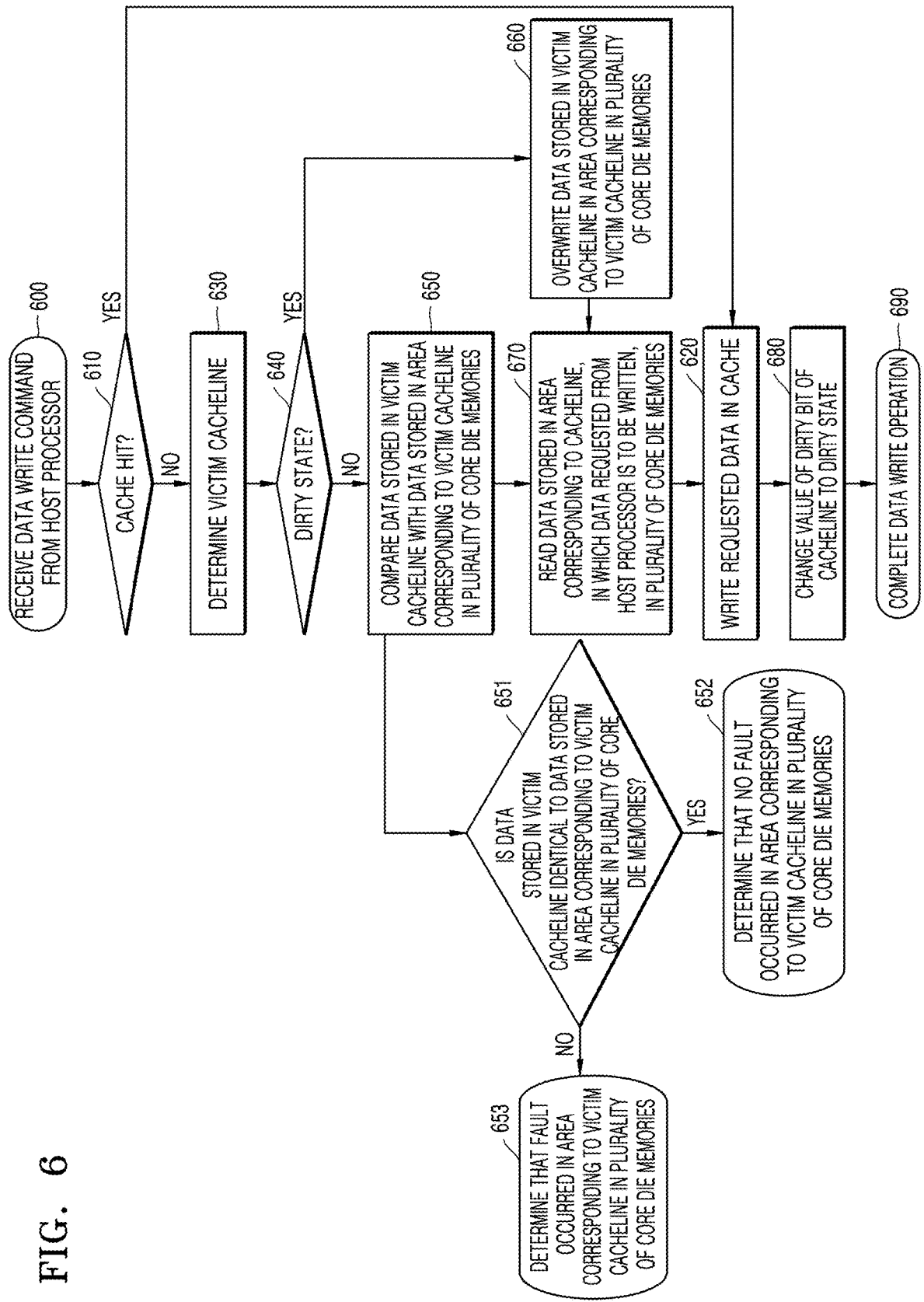
FIG. 6 is a flowchart for describing an example of an operation process and a fault detection process of a three-dimensional stacked memory device according to a data write command.

FIG. 6 is a flowchart for describing an example of an operation process and a fault detection process of a three-dimensional stacked memory device according to a data write command.

In operation 600, the three-dimensional stacked memory device may receive a data write command from a host processor, and the data write command may include an index and a tag value of an address of data.

In operation 610, the three-dimensional stacked memory device may determine whether a cache hit has occurred. More specifically, the three-dimensional stacked memory device may limit cache lines through the index of the address of the data requested from the host processor, and determine whether a value of a tag field of a cache line among the limited cache lines is identical to the tag value of the address of the data requested from the host processor. When the three-dimensional stacked memory device determines that the value of the tag field of the cache line among the limited cache lines is identical to the tag value of the address of the data requested from the host processor, the three-dimensional stacked memory device may determine that a cache hit has occurred, and when the three-dimensional stacked memory device determines that the value of the tag field of the cache line among the limited cache lines is not identical to the tag value of the address of the data requested from the host processor, the three-dimensional stacked memory device may determine that a cache miss has occurred. When the three-dimensional stacked memory device determines that a cache hit has occurred, the three-dimensional stacked memory device may proceed to operation 620. However, when the three-dimensional stacked memory device determines that a cache miss has occurred, the three-dimensional stacked memory device may proceed to operation 630.

In operation 620, the three-dimensional stacked memory device may write the requested data in the cache.

In operation 630, the three-dimensional stacked memory device may determine a victim cache line. The three-dimensional stacked memory device may determine a victim cache line with which is replaced to store the data requested from the host processor.

In operation 640, the three-dimensional stacked memory device may determine whether the victim cache line is in a dirty state. Data stored in the victim cache line may include a dirty bit, and when a value of the dirty bit is 1, this may indicate that the victim cache line is in a dirty state, and when the value of the dirty bit is 0, this may indicate that the victim cache line is in a clean state. When the victim cache line is in a dirty state, this may indicate that data stored in the victim cache line has been updated. When the victim cache line is in a clean state, this may indicate that data stored in the victim cache line has never been updated. When the victim cache line is in a clean state, the three-dimensional stacked memory device may proceed to operation 650. However, when the victim cache line is in a dirty state, the three-dimensional stacked memory device may proceed to operation 660.

In operation 650, the three-dimensional stacked memory device may compare the data stored in the victim cache line with data stored in an area corresponding to the victim cache line in the plurality of core die memories, when the three-dimensional stacked memory device determines that the victim cache line is in a clean state. Because that the value of the dirty bit indicates a clean state means that the data stored in the victim cache line has never been updated, it may be desirable for the data stored in the victim cache line to be identical to the data stored in the area corresponding to the victim cache line in the plurality of core die memories. When the data stored in the victim cache line is not identical to the data stored in the area corresponding to the victim cache line in the plurality of core die memories, it may be predicted that a fault exists in the area corresponding to the victim cache line in the plurality of core die memories.

In operation 651, the three-dimensional stacked memory device may determine whether the data stored in the victim cache line is identical to the data stored in the area corresponding to the victim cache line in the plurality of core die memories. When the data stored in the victim cache line is identical to the data stored in the area corresponding to the victim cache line in the plurality of core die memories, the three-dimensional stacked memory device may proceed to operation 652. However, when the data stored in the victim cache line is not identical to the data stored in the area corresponding to the victim cache line in the plurality of core die memories, the three-dimensional stacked memory device may proceed to operation 653.

In operation 652, the three-dimensional stacked memory device may determine that no fault has occurred in the area corresponding to the victim cache line in the plurality of core die memories, when the data stored in the victim cache line is identical to the data stored in the area corresponding to the victim cache line in the plurality of core die memories.

In operation 653, the three-dimensional stacked memory device may determine that a fault has occurred in the area corresponding to the victim cache line in the plurality of core die memories, when the data stored in the victim cache line is not identical to the data stored in the area corresponding to the victim cache line in the plurality of core die memories.

In operation 660, the three-dimensional stacked memory device may overwrite the data stored in the victim cache line in the area corresponding to the victim cache line in the plurality of core die memories, when the three-dimensional stacked memory device determine that the victim cache line is in a dirty state.

In operation 670, the three-dimensional stacked memory device may read data stored in an area corresponding to a cache line in which the data requested from the host processor is to be written, in the plurality of core die memories.

In operation 680, the three-dimensional stacked memory device may change a value of a dirty bit of the cache line in which the data requested from the host processor is stored, to a dirty state.

In operation 690, the data write operation may be completed.

Figure 7:
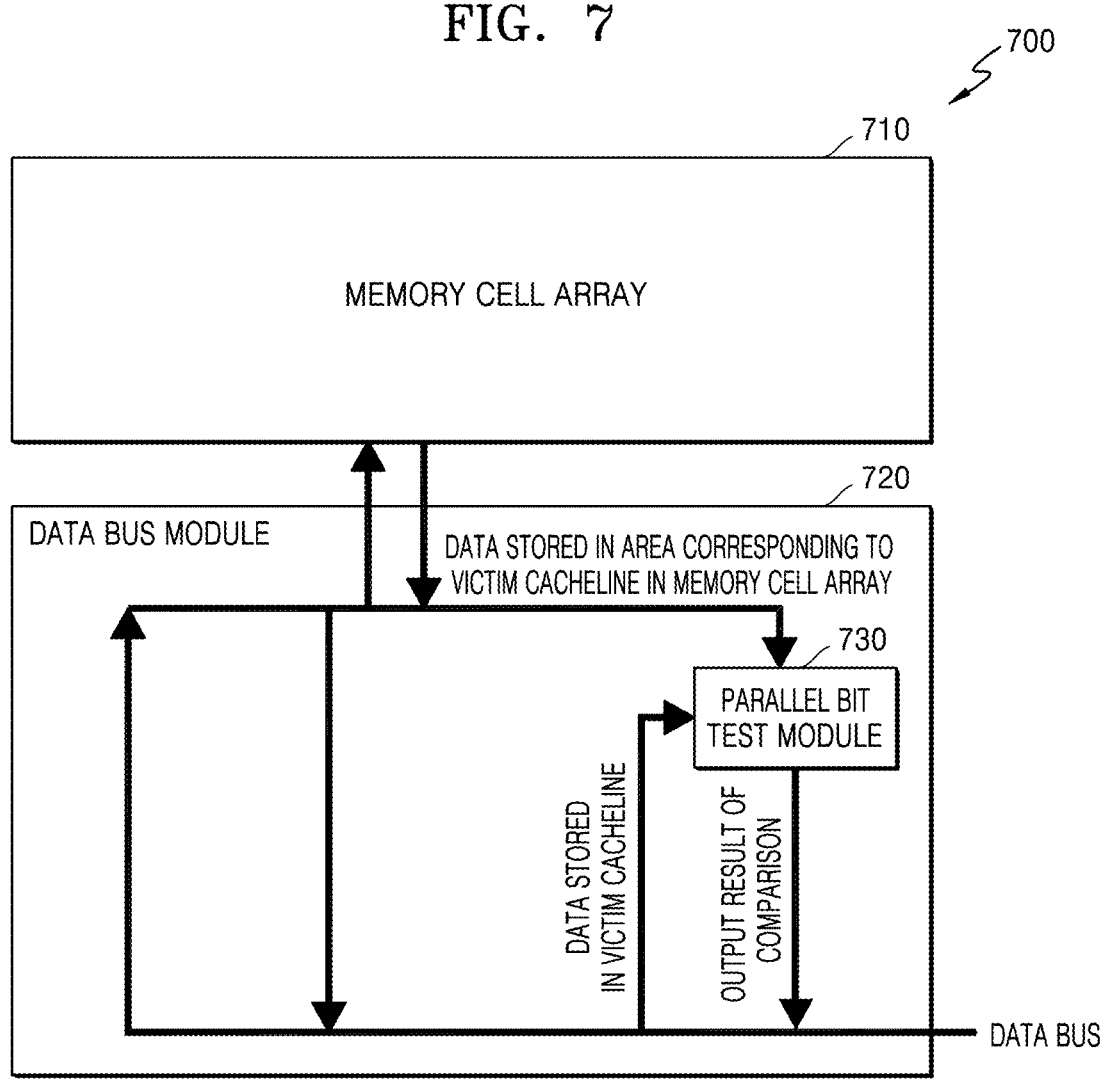
FIG. 7 shows an example of performing a comparison in a parallel bit test module.

FIG. 7 shows an example of performing comparison in a parallel bit test module.

Referring to FIG. 7, a core die memory 700 may include a memory cell array 710 for storing data and a data bus module 720. The memory cell array 710 may include a plurality of unit memory cells. Also, the data bus module 720 may include a parallel bit test module 730. In an example, the core die memory 700 may also further include other general-purpose components in addition to the above-described components.

The parallel bit test module 730 may compare data read from the memory cell array 710 with data received from a cache through a data bus. The data received from the cache may correspond to data stored in a victim cache line. Also, the data read from the memory cell array 710 may correspond to data stored in an area corresponding to the victim cache line in the memory cell array 710.

The parallel bit test module 730 may output the comparison result between the data read from the memory cell array 710 and the data received from the cache through the data bus. The comparison result may be 1 when the data read from the memory cell array 710 is identical to the data received from the cache through the data bus, and may be 0 when the data read from the memory cell array 710 is not identical to the data received from the cache through the data bus, although not limited thereto.

The parallel bit test module 730 may include a parallel bit comparison circuit. More specifically, the parallel bit test module 730 may include one or more parallel bit comparison circuits connected in parallel to each other. Also, each parallel bit comparison circuit may include at least one sub comparison circuit. For example, the sub comparison circuit may include a plurality of XOR gates and a single NOR gate. Each of the XOR gates may compare two pieces of 1-bit data with each other. When the two pieces of 1-bit data are identical to each other, the XOR gate may output '0', and when the two pieces of 1-bit data are not identical to each other, the XOR gate may output '1'. Also, when all inputs are '0', the NOR gate may output '1', and when at least one of inputs is '1', the NOR gate may output '0'.

For example, when data read from the memory cell array 710 includes data of '0100', and data received from the cache includes data of '0100', four XOR gates may compare the data in unit of one bit. In this case, because the data read from the memory cell array 710 is identical to the data received from the cache, all of the XOR gates may output '0'. Because outputs of all the XOR gates are '0', the NOR gate may receive the outputs of '0', and output '1' as the comparison result. Meanwhile, a circuit configuration of the parallel bit comparison circuit is not limited to the above-described configuration.

Meanwhile, the comparison result output from the parallel bit test module 730 may be transmitted to a controller positioned on a spare space of the buffer die through a data bus. The controller may determine whether a fault has occurred in the core die memory based on the comparison result received from the parallel bit test module 730. For example, when the controller receives '0' as the comparison result, the controller may determine that a fault has occurred in the area corresponding to the victim cache line in the memory cell array 710. In this case, the controller may control a second memory module positioned on the spare space of the buffer die to replace the area corresponding to the victim cache line in the memory cell array 710.

Figure 8:
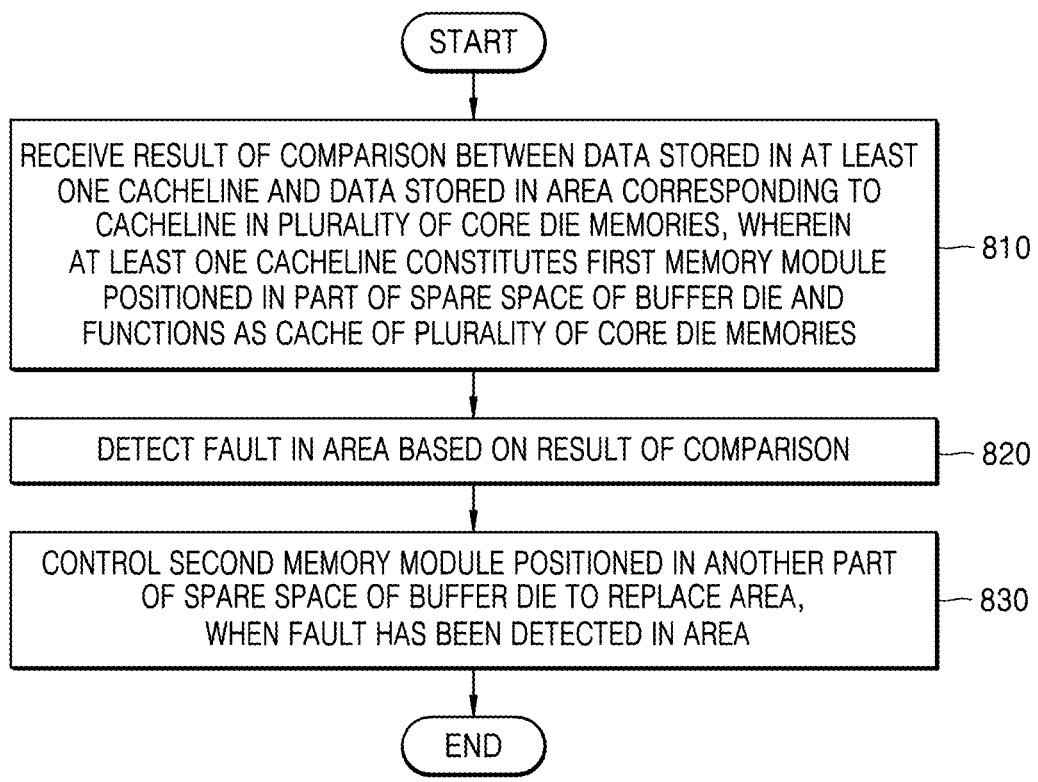
FIG. 8 is a flowchart for describing an example of a control method of a three-dimensional stacked memory device.

FIG. 8 is a flowchart for describing an example of a control method of a three-dimensional stacked memory device.

Referring to FIG. 8, an operating method of the three-dimensional stacked memory device may include operations that are processed sequentially in the three-dimensional stacked memory device shown in FIGS. 1 to 7. Accordingly, the above descriptions related to the three-dimensional stacked memory device shown in FIGS. 1 to 7 will also be applied to the operating method of the three-dimensional stacked memory device of FIG. 8.

In operation 810, the three-dimensional stacked memory device may receive the comparison result between data stored in at least one cache line and data stored in an area corresponding to the cache line in a plurality of core die memories, wherein the at least one cache line may constitute a first memory module positioned in a part of a spare space of a buffer die and functioning as a cache of the plurality of core die memories. When data requested from a host processor does not exist in the at least one cache line of entries in the first memory module, the three-dimensional stacked memory device may determine a victim cache line with which is replaced to store the requested data. In this case, when a value of a dirty bit included in data stored in the victim cache line indicates a clean state, the three-dimensional stacked memory device may compare the data stored in the victim cache line with data stored in an area corresponding to the victim cache line in the plurality of core die memories.

In operation 820, the three-dimensional stacked memory device may detect a fault in the area based on the comparison result. When the three-dimensional stacked memory device receives the comparison result indicating that the data stored in the victim cache line is not identical to the data stored in the area corresponding to the victim cache line in the plurality of core die memories, the three-dimensional stacked memory device may determine that a fault has occurred in the area corresponding to the victim cache line in the plurality of core die memories.

In operation 830, when the three-dimensional stacked memory device determines that a fault has occurred, the three-dimensional stacked memory device may control a second memory module positioned in another part of the spare space of the buffer die to replace the area. When a host processor connected to the three-dimensional stacked memory device tries to access the area at which the fault has occurred in the plurality of core die memories, the three-dimensional stacked memory device may control the host processor to access the second memory module, instead of the corresponding area.

The three-dimensional stacked memory device 200, 300, the buffer die 210, 310, the plurality of core die memories 220, the first memory module 230, 330, the second memory module 240, 340, the controller 250, 350, the first controller 260, 360, the second controller 270, 370 the single core die memory 320, the cache 400, the core die memory 420, the memory cell array 710 and the data bus module 720 in FIGS. 2-8 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 2-8 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A three-dimensional stacked memory device, comprising:
   a plurality of core die memories; and
   a buffer die having the plurality of core die memories stacked thereon and a buffer configured to occupy a first space in the buffer die, the buffer die comprising:
   a first memory module, disposed in a second space unoccupied by the buffer and, configured to operate as a cache of the plurality of core die memories;
   a second memory module, disposed in a third space unoccupied by the buffer and the first memory module; and
   a controller configured to:
      detect a fault in a memory area corresponding to a cache line in the plurality of core die memories based on a result of a comparison between data stored in the cache line and data stored in the memory area corresponding to the cache line in the plurality of core die memories; and
      replace the memory area when the fault is detected in the memory area,
   wherein the cache line is of entries in the first memory module.

2. The three-dimensional stacked memory device of claim 1, wherein in response to the controller receiving the comparison result indicating that the data stored in the cache line is different to the data stored in the memory area corresponding to the cache line in the plurality of core die memories, the controller is further configured to determine that a fault has occurred in the memory area.

3. The three-dimensional stacked memory device of claim 1, wherein, in response to a host processor, which is connected to the three-dimensional stacked memory device, trying to access the memory area in which the fault has been detected, the controller is further configured to control the host processor to access the second memory module instead of the memory area.

4. The three-dimensional stacked memory device of claim 1, wherein the controller is further configured to determine whether data requested from a host processor connected to the three-dimensional stacked memory device exists in the cache line of entries in the first memory module, and
   in response to determining that the data requested from the host processor does not exist in the cache line, the controller is further configured to determine a victim cache line with which is replaced to store the data requested from the host processor.

5. The three-dimensional stacked memory device of claim 4, wherein based on a value of a dirty bit included in data stored in the victim cache line indicating a clean state, the controller is further configured to control a comparison between the data stored in the victim cache line and data stored in a memory area corresponding to the victim cache line in the plurality of core die memories.

6. The three-dimensional stacked memory device of claim 5, wherein the clean state indicates that the data stored in the victim cache line has not been updated.

7. The three-dimensional stacked memory device of claim 4, wherein based on a value of a dirty bit included in data stored in the victim cache line indicating a dirty state, the controller is further configured to overwrite the data stored in the victim cache line in a memory area corresponding to the victim cache line in the plurality of core die memories.

8. The three-dimensional stacked memory device of claim 1, wherein the comparison between the data stored in the cache line and the data stored in the memory area corresponding to the cache line in the plurality of core die memories is performed according to a parallel bit comparison method of comparing, in unit of one bit, bits of the data stored in the cache line in parallel with bits of the data stored in the memory area corresponding to the cache line in the plurality of core die memories.

9. The three-dimensional stacked memory device of claim 1, wherein a parallel bit test module is configured to perform the comparison between the data stored in the cache line and the data stored in the memory area corresponding to the cache line in the plurality of core die memories is performed, and
   the parallel bit test module is positioned on the plurality of core die memories.

10. The three-dimensional stacked memory device of claim 1, wherein in response to all or most memory areas of the second memory module replacing memory areas in which faults occurred in the plurality of core die memories, the controller is further configured to determine whether a hard fault occurred in the memory areas in which the faults have been detected, and to prevent the second memory module from replacing memory areas in which no hard fault occurred from among the memory areas in which the faults have been detected in the plurality of core die memories.

11. A method of a three-dimensional stacked memory device including a plurality of core die memories and a buffer die having a buffer configured to occupy a first space in the buffer die, the method comprising:
   receiving a result of a comparison between data stored in a cache line of entries in a first memory module and data stored in a memory area corresponding to the cache line in the plurality of core die memories, the first memory module, disposed in a second space unoccupied by the buffer and, configured to operate as a cache of the plurality of core die memories;
   detecting a fault in the memory area based on the comparison result; and
   controlling a second memory module, disposed in a third space unoccupied by the buffer and the first memory module, to replace the memory area, upon detecting the fault in the memory area.

12. The method of claim 11, wherein the detecting of the fault in the memory area comprises, in response to receiving the comparison result indicating that the data stored in the cache line is different to the data stored in the memory area corresponding to the cache line in the plurality of core die memories, determining that a fault occurred in the memory area.

13. The method of claim 11, wherein the controlling of the second memory module disposed in the third space comprises, in response to a host processor, which is connected to the three-dimensional stacked memory device, trying to access the memory area in which the fault has been detected, controlling the host processor to access the second memory module instead of the memory area.

14. The method of claim 11, further comprising:
determining whether data requested from a host processor connected to the three-dimensional stacked memory device exists in the cache line of entries in the first memory module, and
in response to determining that the data requested from the host processor does not exist in the cache line, determining a victim cache line with which is replaced to store the data requested from the host processor.

15. The method of claim 14, further comprising:
based on a value of a dirty bit included in data stored in the victim cache line indicating a clean state, comparing the data stored in the victim cache line and data stored in a memory area corresponding to the victim cache line in the plurality of core die memories.

16. The method of claim 15, wherein the clean state indicates that the data stored in the victim cache line has not been updated.

17. The method of claim 14, further comprising:
based on a value of a dirty bit included in data stored in the victim cache line indicating a dirty state, overwriting the data stored in the victim cache line in a memory area corresponding to the victim cache line in the plurality of core die memories.

18. The method of claim 11, wherein the comparison between the data stored in the cache line and the data stored in the memory area corresponding to the cache line in the plurality of core die memories is performed via a parallel bit comparison method of comparing, in units of one bit, bits of the data stored in the cache line in parallel with bits of the data stored in the memory area corresponding to the cache line in the plurality of core die memories.

19. The method of claim 11, further comprising:
in response to all memory areas of the second memory module replacing memory areas in which faults have been detected in the plurality of core die memories, determining whether a hard fault occurred in the memory areas in which the faults have been detected; and
preventing the second memory module from replacing memory areas in which no hard fault occurred from among the memory areas in which the faults have been detected in the plurality of core die memories.

20. A non-transitory computer-readable storage medium storing instructions that, when executed by a processor, cause the processor to perform the method of claim 11.

* * * * *